United States Patent [19]

Wong

[11] 4,081,819

[45] Mar. 28, 1978

[54] MERCURY CADMIUM TELLURIDE DEVICE

[75] Inventor: Theodore T. S. Wong, Maynard, Mass.

[73] Assignee: Honeywell Inc., Minneapolis, Minn.

[21] Appl. No.: 759,922

[22] Filed: Jan. 17, 1977

[51] Int. Cl.² .................................... H01L 27/14
[52] U.S. Cl. ........................... 357/30; 357/72; 357/81; 357/4; 357/28; 156/329
[58] Field of Search .............. 357/30, 61, 81, 72, 357/28, 67, 4; 156/329

[56] References Cited

U.S. PATENT DOCUMENTS

| 2,946,935 | 7/1960 | Finn, Jr. | 317/234 |
| 3,058,041 | 10/1962 | Happ | 317/235 |
| 3,428,871 | 2/1969 | Scott | 317/234 |
| 3,585,272 | 6/1971 | Shatz | 174/528 |
| 3,799,803 | 3/1974 | Kraus | 117/212 |
| 3,965,568 | 6/1976 | Gooch | 29/583 |
| 3,977,018 | 8/1966 | Catagnus | 357/30 |

Primary Examiner—Martin H. Edlow
Attorney, Agent, or Firm—David R. Fairbairn; Theodore F. Neils

[57] ABSTRACT

A mercury cadmium telluride semiconductor device includes an epitaxial layer of mercury cadmium telluride on a first substrate. A silicone rubber adhesive layer bonds the first substrate to a second substrate.

4 Claims, 1 Drawing Figure

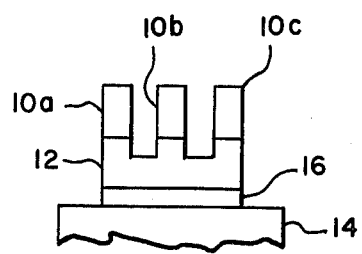

MERCURY CADMIUM TELLURIDE DEVICE

ORIGIN OF THE INVENTION

The present invention was made in the course of a contract with the Department of Army.

BACKGROUND OF THE INVENTION

The present invention is concerned with semiconductor devices using epitaxial layers of mercury cadmium telluride. In the present application, the common chemical notations for mercury cadmium telluride, (Hg,Cd)Te or $Hg_{1-x}Cd_xTe$, will be used.

Mercury cadmium telluride is an intrinsic photodetector material which consists of a mixture of cadmium telluride, a widegap semiconductor ($E_g$ = 1.6eV), with mercury telluride, which is a semimetal having a "negative energy gap" of about 0.3eV. The energy gap of the alloy varies linearly with $x$, the mole fraction of cadmium telluride in the alloy. By properly selecting "$x$", it is possible to obtain mercury cadmium telluride detector material having a peak response over a wide range of infrared wavelengths.

(Hg,Cd)Te is of particular importance as a detector material for the important 8 to 14 micron atmospheric transmission "window." Extrinsic photoconductor detectors, notably mercury doped germanium, have been available with high performance in the 8 to 14 micron wavelength interval. These extrinsic photoconductors, however, require very low operating temperatures (below 30° K). (Hg,Cd)Te intrinsic photodetectors having a spectral cutoff of 14 microns, on the other hand, are capable of high performance at 77° K.

At the present time, most (Hg,Cd)Te is produced by bulk growth techniques such as the technique described by P. W. Kruse et al in U.S. Pat. No. 3,723,190. High quality (Hg,Cd)Te crystals are produced by this bulk growth technique.

Epitaxial growth techniques offer a number of potential advantages over bulk growth techniques. An epitaxial layer is a smooth continuous film grown on a substrate, such that the film crystal structure corresponds to and is determined by that of the substrate. The desired epitaxial layer is single crystal with uniform thickness and electrical property. The substrate has a different composition or electrical properties from that of the epitaxial layer.

A number of epitaxial growth techniques have been investigated in an attempt to grow (Hg,Cd)Te layers. Vapor phase epitaxial growth processes which have been studied are described in a number of patents including R. Ruehrwein (U.S. Pat. No. 3,496,024), G. Manley et al (U.S. Pat. No. 3,642,529), D. Carpenter et al (U.S. Pat. No. 3,619,283), R. Lee et al (U.S. Pat. No. 3,642,529), and R. Hager et al (U.S. Pat. No. 3,725,135).

Another epitaxial growth technique which has been investigated is liquid phase epitaxy ("LPE"). This technique is described in R. Maciolek et al (U.S. Pat. No. 3,902,924). Liquid phase epitaxial growth offers a number of advantages over both vapor phase epitaxial growth and bulk growth of (Hg,Cd)Te.

In a typical fabrication of mercury cadmium telluride epitaxial devices, individual devices are delineated by a process such as air abrasion or etching. Electrical contacts are then formed on the devices. The epitaxial layer and substrate are then bonded to a second substrate, which may be a "flat pack" which is subsequently attached to the cold finger of a Dewar or may be the Dewar itself.

(Hg,Cd)Te devices are typically used as photodetectors for infrared radiation. In order to obtain the desired sensitivity to infrared radiation, the (Hg,Cd)Te devices are operated at cryogenic temperatures in a Dewar. The operating temperatures are typically 77° K or less and may, on occasion, be about 5° K.

A problem has been encountered with the prior art epitaxial mercury cadmium telluride devices. The most common difficulty encountered in epitaxial (Hg,Cd)Te detector array development has been that the substrates sometimes cracked when cooled to cryogenic temperatures. At 77° K cracking sometimes has occurred, and the problem has been even more pronounced for devices cooled to 5° K.

SUMMMARY OF THE INVENTION

The present invention is based upon my discovery of the cause of the substrate cracking problem in (Hg,Cd)Te epitaxial devices. The cause of the cracking problem was the glass adhesive which was used in the prior art devices as the bonding layer between the first and second substrate. It was determined that the glass adhesive has a temperature conductivity which was too low. As a result, the glass adhesive caused temperature differences between the first and second substrates which were sufficient to cause cracking when the (Hg,Cd)Te devices were cooled to low temperatures.

The solution to the cracking problem has been achieved by the use of silicone rubber adhesive for bonding the epitaxial layer and first substrate to the second substrate. The silicone rubber adhesive has a higher thermal conductivity than the previously used glass adhesive and, therefore, the cracking problem is alleviated.

BRIEF DESCRIPTION OF THE DRAWINGS

The FIGURE shows a (Hg,Cd)Te epitaxial device.

DETAILED DESCRIPTION OF THE PREFERRED EMBODIMENT

A (Hg,Cd)Te epitaxial device as shown in the FIGURE. A (Hg,Cd)Te epitaxial layer has been delineated to form individual devices 10a, 10b, and 10c on substrate 12. First substrate 12 is a crystalline substrate and, in one preferred embodiment, is cadmium telluride. First substrate 12 is bonded to a second substrate 14 by bonding layer 16.

In the prior art, bonding layer 16 was a glass adhesive such as "Glasshesive" produced by Adhesive Engineering Company. In the present invention, adhesive layer 16 is a silicone rubber adhesive such as Dow Corning 3110, 3112, and 3116 RTV silicone rubbers. The silicone rubber bonding layer has a thermal conductivity of $\geq$ about $5.0 \times 10^{-4}$ cal gm/cm$^2$-sec(° C/cm), which is higher than the prior art glass adhesive bonding layer. It has been discovered that the glass adhesive, with its lower thermal conductivity, was the cause of the substrate cracking problem encountered in the prior art (Hg,Cd)Te epitaxial devices.

There were at least three possible causes of the cracking problem in the prior art (Hg,Cd)Te epitaxial devices. These were (1) the glass adhesive used to bond the first substrate to the second substrate, (2) the degree of air abrasion used to delineate individual devices, and (3) the pressure of the thermocompression bonding used to attach leads to the devices. The last two potential causes could potentially introduce microfractures to the device during processing which would subsequently become substantial cracks upon cooling to cryogenic temperatures.

In order to identify the cause of the cracking problem, controlled experiments were performed with three combinations of the three possible causes. In the first combination, the air abrading depth was 60 microns, the thermocompression bonding pressure was 40 grams, and the adhesive used was a glass adhesive. In the second combination, the air abrading depth was again 50 microns and the bonding pressure was again 40 grams, but the adhesive used was a silicone rubber adhesive. In the third combination, the air abrading depth was 15 microns, the bonding pressure was 5 grams, and the adhesive was once again a silicone rubber adhesive.

Upon cooling to 5° K, only the device having a glass adhesive exhibited cracking. The two devices having silicone rubber adhesive as the bonding layer exhibited no cracking. As a result of these experiments, it was evident that the glass adhesive was the cause of the substrate cracking. Subsequent use of silicone rubber adhesive as the bonding layer has overcome the cracking problem.

In conclusion, the cause of a major problem in the development of (Hg,Cd)Te epitaxial devices has been identified. By the use of silicone rubber adhesive as the bonding layer between the first and second substrates, the cracking problem encountered in the prior art has been overcome.

Although the present invention is described with reference to a series of preferred embodiments, workers skilled in the art will recognize that changes may be made in form and detail without departing from the spirit and scope of the invention. For example, although silicone rubber adhesive is the preferred bonding layer material, other bonding layer materials may also be used provided they have a thermal conductivity $\geq$ about $5.0 \times 10^{-4}$ cal gm/cm$^2$-sec(° C/cm).

The embodiments of the invention in which an exclusive property or right is claimed are defined as follows:
1. An infrared photodetector comprising:
   a first substrate;
   an epitaxial layer of (Hg,Cd)Te on the first substrate;
   a second substrate; and
   a silicone rubber adhesvie layer bonding the first substrate to the second substrate.
2. The infrared photodetector of claim 1 wherein the first substrate is CdTe.
3. In a (Hg,Cd)Te semiconductor device including (Hg,Cd)Te epitaxial layer on a first substrate and a bonding layer for bonding the first substrate to a second substrate, the improvement comprising a bonding layer having a thermal conducitivity $\geq$ about $5.0 \times 10^{-4}$ cal gm/cm$^2$-sec(° C/cm).
4. The invention of claim 3 wherein the bonding layer comprises a silicone rubber adhesive.

* * * * *